United States Patent
Kikuchi

(10) Patent No.: US 6,495,856 B2
(45) Date of Patent: Dec. 17, 2002

(54) SEMICONDUCTOR DEVICE HAVING A TEST PATTERN SAME AS CONDUCTIVE PATTERN TO BE TESTED AND METHOD FOR TESTING SEMICONDUCTOR DEVICE FOR SHORT-CIRCUIT

(75) Inventor: Hiroaki Kikuchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/843,090

(22) Filed: Apr. 25, 2001

(65) Prior Publication Data

US 2001/0035525 A1 Nov. 1, 2001

(30) Foreign Application Priority Data

Apr. 27, 2000  (JP) .......................................... 2000-127427

(51) Int. Cl.[7] .............................................. H01L 23/58
(52) U.S. Cl. .............................. 257/48; 438/11; 438/14; 438/15; 438/18
(58) Field of Search ............................. 257/48; 438/11, 438/14, 15, 18

(56) References Cited

U.S. PATENT DOCUMENTS

| | | | | |
|---|---|---|---|---|
| 4,650,333 A | * | 3/1987 | Crabb et al. ................. | 356/376 |
| 5,821,761 A | * | 10/1998 | Shida et al. ................. | 324/751 |
| 6,080,597 A | * | 6/2000 | Moon ........................... | 257/48 |

FOREIGN PATENT DOCUMENTS

JP          4-314032          11/1992

* cited by examiner

Primary Examiner—Hoai V. Ho
Assistant Examiner—Andy Huynh
(74) Attorney, Agent, or Firm—Choate, Hall & Stewart

(57) ABSTRACT

A semiconductor random access memory device has stacked capacitor electrodes and test conductive pieces laid on the same pattern as the stacked capacitor electrodes, and the test conductive pieces are alternately isolated from and connected to a ground line, wherein the test conductive pieces are scanned with an electron beam to see whether or not any one of the conductive pieces generates secondary electrons different in intensity from those radiated from the other conductive pieces for detecting a short-circuit, whereby an analyst investigates the stacked capacitor electrodes for a possible short-circuit.

10 Claims, 5 Drawing Sheets

SEMICONDUCTOR DEVICE HAVING A TEST PATTERN SAME AS CONDUCTIVE PATTERN TO BE TESTED AND METHOD FOR TESTING SEMICONDUCTOR DEVICE FOR SHORT-CIRCUIT

FIELD OF THE INVENTION

This invention relates to a diagnosing technology for a semiconductor device and, more particularly, to a semiconductor device and a method for testing a semiconductor device for short-circuits.

DESCRIPTION OF THE RELATED ART

A short-circuit is fatal to semiconductor devices, and lowers the production yield. When the short-circuit is detected in a semiconductor device, it is important for the manufacturer to investigate the cause of the short-circuit. One of the approaches to the cause of the short-circuit is a direct observation on the short-circuit. Conventionally, an optical microscope was used in the direct observation. The design rule has been severe, and the conductive lines are presently arranged at high dense on a semiconductor chip. In this situation, it is hard to observe the conductive lines directly with the optical microscope. Moreover, a possible portion of the short-circuit is merely detected through the direct observation with the optical microscope. The short-circuit is to be confirmed through an electric test. This results in a large amount of time and labor consumed for the diagnosis.

In order to make the test simple, it is proposed to test a semiconductor device with a scanning electron beam microscopy. A typical example of the testing method using the scanning electron beam microscopy is disclosed in Japanese Patent Publication of Unexamined Application No. 4-314032. FIG. 1 shows a substrate 106 for an array of thin film transistors. Gate lines 107 and source lines 108 are laid on a lattice pattern, and the gate lines 107 are electrically isolated from the source lines 108.

The prior art testing method is based on the charge-up phenomenon in the insulating during the observation with the scanning electron beam microscopy, and the array of thin film transistors is tested as follows. First, the substrate 106 is fixed to the sample table of the scanning electron beam microscopy, and is electrically isolated. Conductive tapes 103 and 109 are adhered to the substrate 106. The conductive tape 109 extends over the gate lines 107, and the gate lines 107 are short-circuited. On the other hand, the conductive tape 103 extends over the source lines 108, and the source lines 108 are short-circuited. A switching unit 101 is connected between the conductive tape 109 and a ground line 102 for the gate lines 107, and another switching unit 104 is connected between the conductive tape 103 and a ground line 105 for the source lines 108.

An analyst checks the array of thin film transistors to see whether or not any gate line 107 is short-circuited with the source lines 108 at the overlapped portions therebetween as follows. First, the analyst turns on the switching unit 101, and turns off the other switching unit 104. The gate lines 107 are grounded through the conductive tape 109 and the switching unit 101, and the source lines 108 are electrically isolated from the ground line 105. Subsequently, the source lines 108 are charged. The source lines 107 are designed to be electrically isolated from the gate lines 108. Therefore, if the source lines 107 are surely isolated from the gate lines 107, the charge-up phenomenon takes place at all the overlapped portions. However, if a source line 108 is short-circuited with the gate line 107, the overlapped portion is never charged. The short-circuit is detectable on the basis of the difference between the charge-up portions and non-charged portion.

FIG. 2 shows a test pattern formed in a semiconductor device to be tested through another prior art method. The prior art method is disclosed in IEEE TRANSACTION ON SEMICONDUCTOR MANUFACTURING, pages 384–389, 1997. Conductive pads 201 are arranged on a semiconductor substrate, and a test pattern 202 is formed among the conductive pads 201. The test pattern 202 is connected through a conductive buried-layer and a diffused region (not shown) to the semiconductor substrate or the ground 203. The semiconductor substrate is placed in vacuum, and is scanned with an electron beam. When the conductive pads 201 are radiated with the electron beam, secondary electrons are generated. The amount of secondary electrons is measured. If a conductive pad 201 is short-circuited with the test pattern due to an improper pattern transfer, the amount of secondary electrons is reduced. Thus, the analyst checks the dispersion of the secondary electrons to see whether or not a short-circuit takes place.

A semiconductor dynamic random access memory device is designed under the most severe design rules. The semiconductor dynamic random access memory cell is implemented by a series combination of an access transistor and a storage capacitor. In case where a stacked storage capacitor is employed in the dynamic random access memory device, miniature capacitor electrodes are arrayed on an inter-layered insulating layer at high dense, and a short-circuit is liable to take place between the adjacent miniature capacitor electrodes. The stacked storage capacitor is so small that a miniature short-circuit affects the data holding characteristics of the dynamic random access memory cell. However, such a miniature short-circuit is hardly observed with the scanning electron beam microscopy, because the image of miniature short-circuit is affected by noise due to fluctuation of the device pattern.

The above-described prior art detecting technologies have the following problems. Only the short-circuit between the conductive lines connected through the conductive tapes 103/109 is detectable through the first prior art testing method shown in FIG. 1. Even if a short-circuit takes place between the conductive line 107/108 and an isolated conductive piece, the analyst can not specify the short-circuit through the first prior art testing method shown in FIG. 1. When the analyst checks the array of stacked capacitor electrodes for a short-circuit, he or she needs to prepare a lot of miniature conductive tapes and micro-switches, and adheres the miniature conductive tapes between the stacked capacitor electrodes of all the combinations. It is not feasible. Therefore, the first prior art method is not applicable to the array of stacked capacitor electrodes.

On the other hand, the test pattern 202 consisting of conductive lines is required for the second prior art testing method shown in FIG. 2. The test pattern 202 is formed on the semiconductor chip for the testing use only, and the test pattern 202 render the layout between the conductive pads 201 and the test pattern 202 different from the actual layout of the conductive pads 201. When the second prior art testing method is applied to the array of stacked capacitor electrodes, a test pattern is to be formed in the array of stacked capacitor electrodes. However, the stacked capacitor electrodes are patterned under the most severe design rules. Therefore, it is impossible to form the test pattern in the array of stacked capacitor electrodes. In other words, the second testing method is available for an array of conductive pieces not patterned under the most severe design rules.

SUMMARY OF THE INVENTION

It is therefore an important object of the present invention to provide a method for testing a semiconductor device for a short-circuit in an array of miniature conductive pieces.

It is another important object of the present invention to provide a semiconductor device, which is to be tested through the testing method.

To accomplish the object, the present invention proposes to form a miniature test pattern same as a conductive pattern to be test.

In accordance with one aspect of the present invention, there is provided a semiconductor device fabricated on a substrate comprising an insulating layer formed over a major surface of the substrate, conductive strips laid on a pattern on the insulating layer and incorporated in an electric circuit, and test conductive strips laid on at least a part of the pattern on the insulating layer concurrently with the patter of conductive strips, and broken down into a first group consisting of certain test conductive strips electrically isolated and a second group consisting of remaining test conductive strips alternated with the certain test conductive strips and connected to another conductive strip.

In accordance with another aspect of the present invention, there is provided a method of testing conductive strips for a short-circuit comprising the steps of a) preparing test conductive strips alternately isolated and laid on a part of a pattern of the conductive strips formed over a substrate, b) scanning the test conductive strips with an electron beam for measuring the intensity of secondary electron and c) checking a dispersion of the intensity of the secondary electron to see whether or not the amount of secondary electron radiated from any one of the test conductive strips is different from the amount of secondary electron radiated from others of the test conductive strips for determining a short-circuit.

BRIEF DESCRIPTION OF THE DRAWINGS

The features and advantages of the semiconductor device and the method will be more clearly understood from the following description taken in conjunction with the accompanying drawings in which.

DESCRIPTION OF THE PREFERRED EMBODIMENTS

First Embodiment

Figure 1:
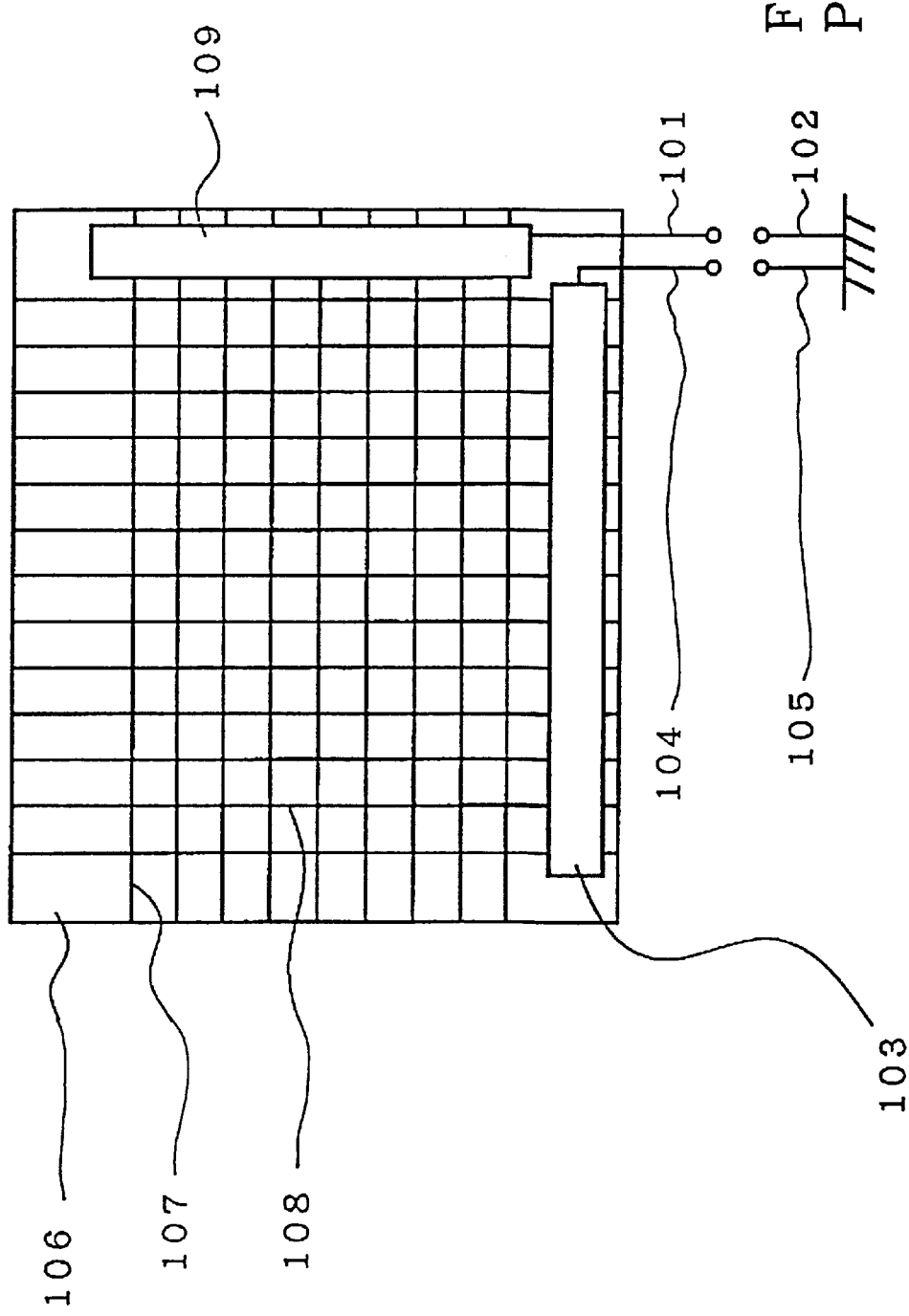
FIG. 1 is a schematic plane view showing the array of thin film transistors subjected to the prior art testing method.
Figure 2:
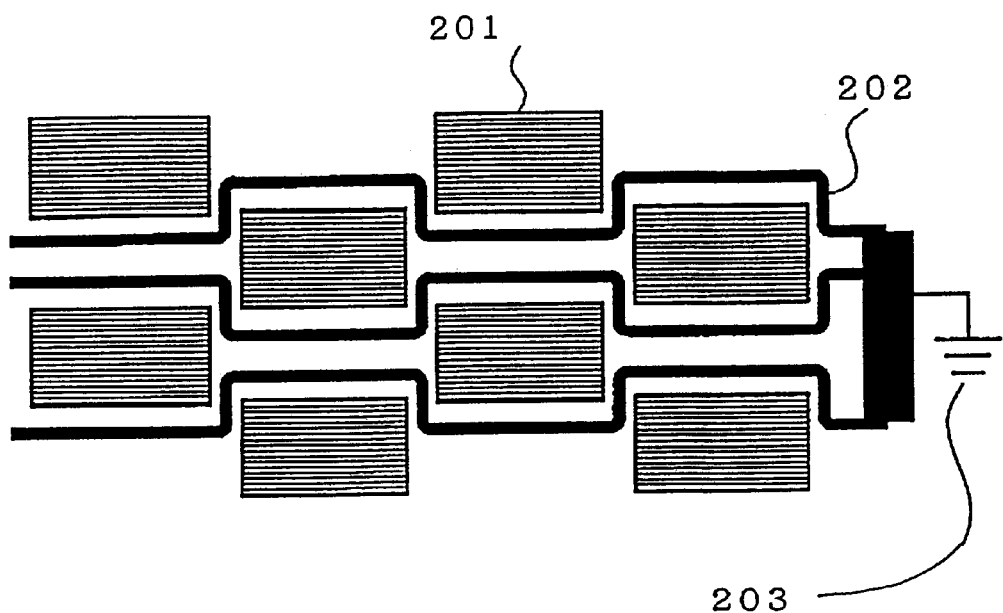
FIG. 2 is a schematic plane view showing the prior art testing pattern formed in the semiconductor device.
Figure 3:
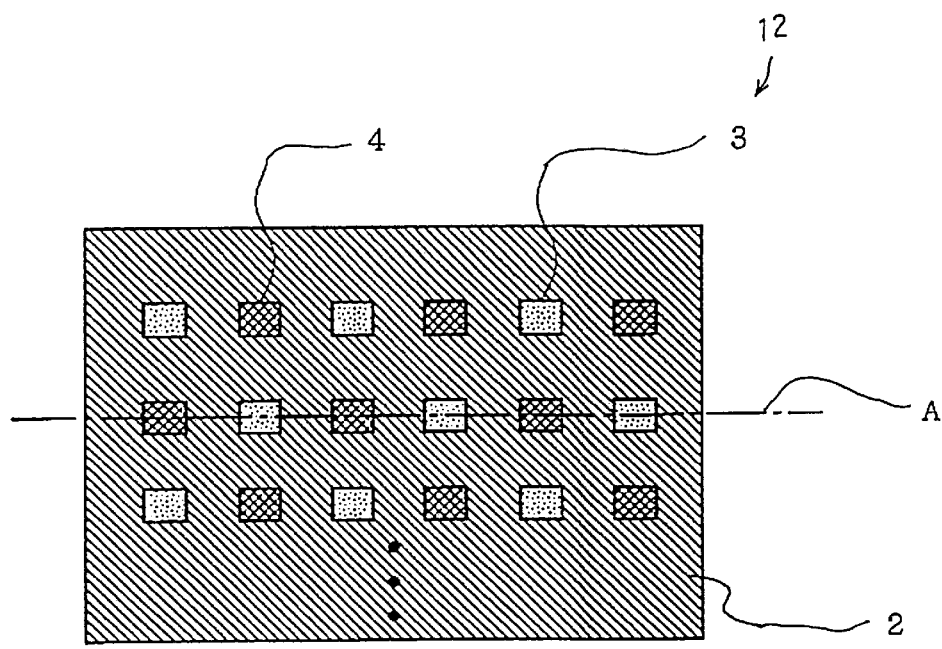
FIG. 3 is a plane view showing an array of test conductive pieces incorporated in a test pattern according to the present invention.
Figure 4:
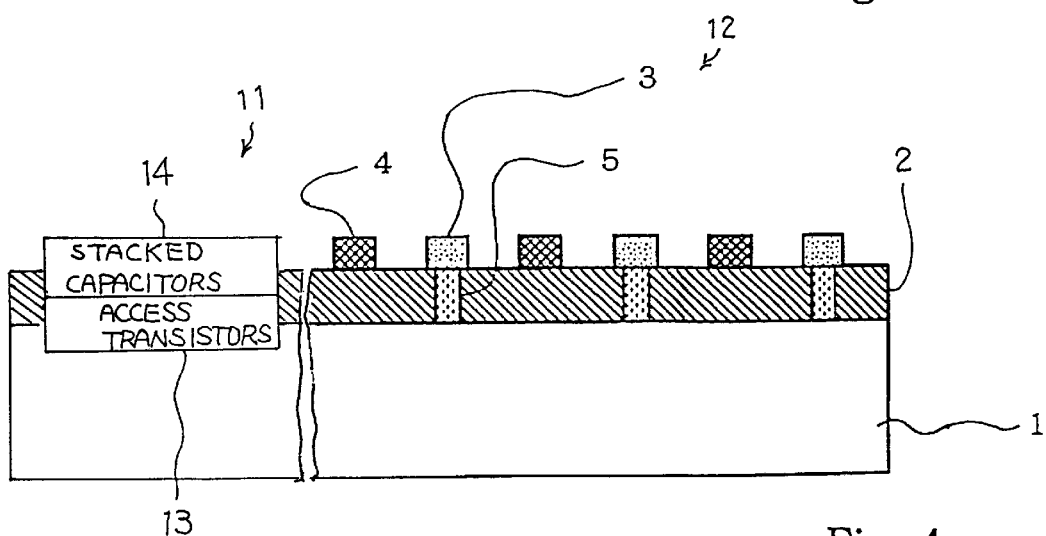
FIG. 4 is a cross sectional view taken along line A and showing the structure of a semiconductor dynamic random access memory device according to the present invention.

Referring to FIGS. 3 and 4 of the drawings, a semiconductor integrated circuit device is fabricated on a semiconductor chip 1. The semiconductor integrated circuit device is categorized in a dynamic random access memory, and includes a dynamic random access memory cell array 11, a peripheral circuit (not shown) and a test pattern 12. The semiconductor chip 1 has a major surface, and an inter-layered insulating layer 2 is grown so as to cover the major surface. The inter-layered insulating layer 2 has an upper surface, which is assigned partially to the dynamic random access memory cell array 11 and partially to the test pattern 12. The area assigned to the test pattern 12 is indicated by hatching lines in FIG. 3.

Each of the dynamic random access memory cells is implemented by a series combination of an access transistor 13 and a stacked storage capacitor 14. The access transistor 13 is of a MIS (Metal-Insulator-Semiconductor) field effect transistor, and has a channel region in a surface portion of the semiconductor chip 1. The access transistors are covered with the inter-layered insulating layer, which forms a part of a multi-layered insulating layer.

The stacked storage capacitors 14 have respective capacitor electrodes, dielectric layers and plate electrodes. The capacitor electrodes are patterned on the inter-layered insulating layer, and the adjacent two capacitor electrodes are spaced from one another by a gap. The gap is the narrowest as defined in the design rules. The capacitor electrodes are covered with the dielectric layers, and are held in contact with the source regions of the access transistors through node contact holes formed in the inter-layered insulating layer 2, respectively. The plate electrodes are formed on the dielectric layers, and the capacitor electrodes are opposed to the plate electrodes through the dielectric layers.

The test pattern 12 has a plurality of conductive strips 3 and 4, and the conductive strips are formed on the inter-layered insulating layer 2. The conductive strips 3 and 4 are two-dimensionally arranged on the inter-layered insulating layer 2, and the conductive strips labeled with reference numeral 3 are altered with the conductive strips labeled with reference numeral 4. Contact holes are formed in the inter-layered insulating layer 2, and the major surface of the semiconductor chip 1 is exposed to the contact holes. The conductive plugs 5 fill the contact holes, respectively. The conductive plugs 5 are located under the conductive strips 3, and are held in contact with the major surface of the semiconductor chip 1. Thus, the conductive plugs 5 are provided between the conductive strips 3 and the major surface of the semiconductor chip 1, and the conductive strips 3 are electrically connected to the semiconductor chip 1 by means of the conductive plugs 5.

The conductive strips 3 and 4 are similar in shape to the capacitor electrodes, and each of the conductive strips 3/4 is spaced from the adjacent conductive strips 4/3 by the narrowest gap defined as the minimum design rule. In this instance, the conductive strips 3 and 4 are equal in dimensions to the capacitor electrodes. The test pattern 12 or the array of conductive strips 3 and 4 is formed concurrently with the capacitor electrodes.

The capacitor electrodes and the test pattern 12 are concurrently formed as follows. The access transistors 13 and lower signal lines are covered with the inter-layered insulating layer 2, and the node contact holes and the contact holes for the conductive plugs 5 are formed in the inter-layered insulating layer 2. In detail, conductive material is deposited over the entire surface of the inter-layered insulating layer 2, and the node contact holes and the contact holes are filled with the conductive material. The conductive material layer is chemically mechanically polished, and the node conductive plugs and the conductive plugs 5 are left in the node contact holes and the contact holes, respectively. The conductive plugs 5 make the associated conductive strips 3 grounded to the semiconductor chip 1.

Subsequently, the capacitor electrodes and the test pattern 12 are formed on the inter-layered insulating layer 2 by using a chemical vapor deposition and photo-lithographic techniques as follows. Conductive material such as, for example, impurity-doped polysilicon is deposited over the entire surface of the resultant structure. The inter-layered insulating layer 2 is covered with the impurity-doped polysilicon layer, and the node contact plugs and the conductive plugs 5 are held in contact with the lower surface of the impurity-doped polysilicon layer.

Photo-resist solution is spun onto the conductive material layer, and is baked so as to form a photo-resist layer. An image for the capacitor electrodes and the conductive strips 3 and 4 is transferred from a photo-mask to the photo-resist layer. Each of the capacitor electrodes is designed to be spaced from the adjacent capacitor electrodes by the narrowest gap, and each of the conductive strips 3 and 4 is also designed to be spaced from the adjacent conductive strips 4 and 3 by the narrowest gap. Upon completion of the pattern transfer, a latent image for the capacitor electrodes and the conductive strips 3 and 4 is formed in the photo-resist layer. The latent image is developed, and a photo-resist etching mask (not shown) is left on the conductive material layer. Using the photo-resist etching mask, the conductive material layer is etched, and the capacitor electrodes and the conductive strips 3 and 4 are left on the inter-layered insulating layer 2. The capacitor electrodes are held in contact with the node contact plugs, respectively, and the conductive strips 3 are respectively held in contact with the conductive plugs 5, respectively. Thus, the capacitor electrodes and the test pattern 12 are formed on the inter-layered insulating layer 2 through the photo-lithographic techniques.

If the pattern transfer is improper, a pattern defect is left in the photo-resist etching mask, and, accordingly, the pattern defect is transferred to the conductive material layer. If the etching is improper, pieces of etching residue are left on the inter-layered insulating layer 2. These conductive pieces, which are undesirably left on the inter-layered insulating layer 2, are causative of a short-circuit between the capacitor electrodes. When the conductive pieces are undesirably left in the area assigned to the dynamic random access memory cell array, other conductive pieces are liable to be left in the area assigned to the test pattern. The conductive pieces are also causative of a short-circuit between the conductive strip 3 and the adjacent conductive strip 4. If a capacitor electrode is short-circuited with the adjacent capacitor electrode due to an improper step, the improper step possibly has the same influence on the test pattern, and a short-circuit takes place in the test pattern 12 due to the same improper step. Therefore, when a short-circuit takes place in the capacitor electrodes, an analyst checks the test pattern to see whether or not a conductive strip 3/4 is electrically connected to the adjacent conductive strip 4/3 for the trouble shooting. A scanning electron beam microscopy is used in the analysis as follows.

First, the semiconductor integrated circuit device is placed in a vacuum chamber of the scanning electron beam microscopy, and an electron beam is radiated to the semiconductor integrated circuit device. The area assigned to the test pattern 12 is scanned with the electron beam. An appropriate grid is placed in front of a detector so as to cause the detector to capture only the secondary electron with the energy over a threshold.

Assuming now that one of the conductive strips 4 is properly isolated from the adjacent conductive strips 3, when the conductive strips 4 is radiated with the electron beam, the conductive strip 4 is positively or negatively charged, and the energy of the secondary electron is negatively or positively shifted. When the conductive strip 4 is positively charged, the amount of secondary electron captured by the grid is smaller than the amount of secondary electron radiated from the non-charged conductive strip 3. On the other hand, if the conductive strip 4 is negatively charged, the amount of secondary electron captured by the grid is larger than the amount of secondary electron radiated from the non-charged conductive strip 3. The polarity of the charged conductive strip 4 is dependent on the material and the dimensions of the conductive strip 4, the material of the inter-layered insulating layer 2 and the energy of the electron beam.

If the conductive strip 4 to be positively charged is short circuited with the adjacent conductive strip 3, the conductive strip 4 is not charged, because the conductive strip 3 is grounded to the semiconductor substrate 1. The energy of secondary electron radiated from the conductive strip 4 short circuited with the adjacent conductive strip 3 is higher than that radiated from a conductive strip 4 positively charged, and the amount of secondary electron captured by the grid is more than that radiated from the conductive strip 4 positively charged.

The analyst decides whether or not a short-circuit takes place on the basis of the dispersion of the amount of secondary electron. The amount of secondary electron is compared with a threshold, or the amount of secondary electron radiated from every second conductive strip is picked up from the dispersion for comparing each value with other values.

When a conductive strip 4 is short circuited with the adjacent conductive strips 3, the analyst observes the conductive strip 4 for the trouble shooting.

The present inventor evaluated the above-described testing method. First, the present inventor fabricated the structure shown in FIG. 4 on the semiconductor substrate 1. The inter-layered insulating layer 2 was 500 nanometers thick, and the contact holes were formed in the inter-layered insulating layer 2 by using the photo-lithography and the dry etching. The contact hole measured 0.5 micron square. Boron-doped polysilicon was deposited to 0.6 micron thick on the inter-layered insulating layer 2 by using the chemical vapor deposition technique. The boron-doped polysilicon layer was chemically mechanically polished so that the conductive plugs were left in the contact holes. The boron-doped polysilicon was deposited to 0.5 micron thick over the entire surface of the resultant structure, and the boron-doped polysilicon layer was patterned into the conductive strips 3 and 4 by using the photo-lithography and the dry etching. The conductive strip 3/4 was 0.5 micron in width and 1 micron in length. Thus, a sample was fabricated.

Figure 5:
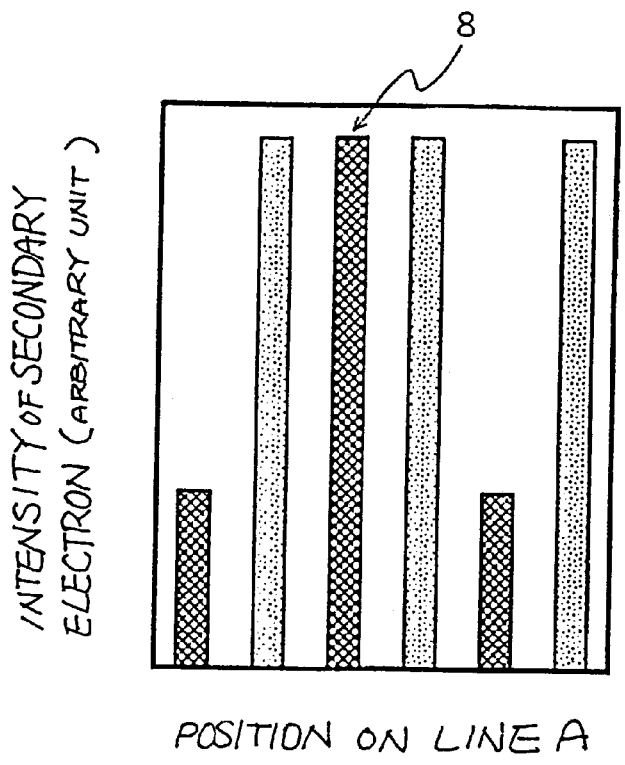
FIG. 5 is a graph showing a dispersion of the intensity of secondary electron along line A.

Subsequently, the present inventor placed the sample in a scanning electron beam microscopy, and radiated the test pattern 12 along line A (see FIG. 3) with an electron beam at 1 kilo-volt. The intensity of secondary electron was plotted in FIG. 5. When the conductive strip 4 at point 8 was radiated with the electron beam, the intensity of secondary electron was as strong as that radiated from the adjacent conductive strips 3, and was much stronger than that radiated from the conductive strips 4 on the left/right sides of the conductive strips 3. The present inventor focused the scanning electron beam microscopy on the conductive strip 4 at point 8, and confirmed that the conductive strip 4 at point 8 was short circuited with the adjacent conductive strip 3.

As will be understood from the foregoing description, the conductive strips 3/4 are designed and formed under the minimum design rule as similar to the stacked capacitor electrodes of the dynamic random access memory cells. If the pattern transfer and/or the dry etching is improper, the short-circuits possibly take place in the test pattern 12 as well as the stacked capacitor electrode array. Any additional wiring strip is not required for the testing method according to the present invention. Thus, the test pattern 12 does not occupy a wide area, and the short-circuit is certainly detected.

Moreover, the time period consumed by the test is shortened. This is because of the fact that the test pattern 21 is scanned with the relatively wide electron beam, because the intensity of secondary electron is monitored.

Finally, the relatively wide conductive strips 4 are scanned with the electron beam. It is not required directly to scan the short-circuit with the electron beam. Even if an extremely small piece of conductive material is the origin of the short-circuit, the analyst can scan the conductive strips 4 with the electron beam. This results in that the analyst can find the short-circuit resulted from the extremely small piece of conductive material.

Second Embodiment

Figure 6:
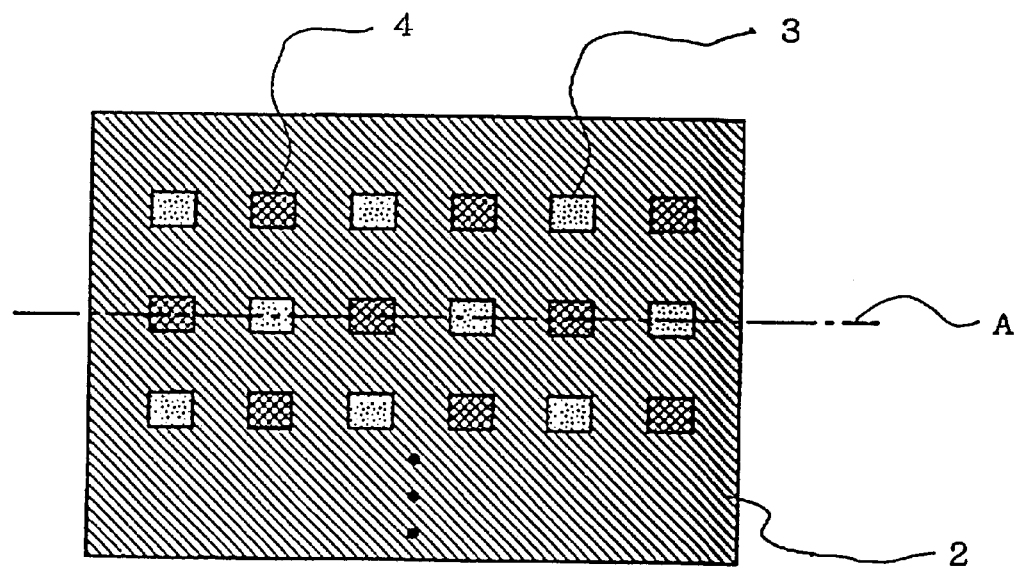
FIG. 6 is a plane view showing another test pattern according to the present invention.
Figure 7:
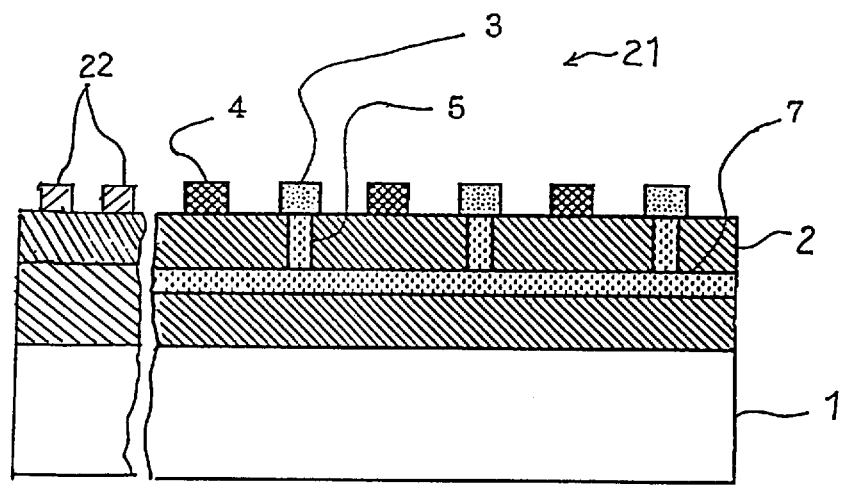
FIG. 7 is a cross sectional view taken along line A and showing the structure another semiconductor dynamic random access memory device according to the present invention.

Turning to FIGS. 6 and 7, another test pattern 21 according to the present invention is formed on an upper inter-layered insulating layer 2. The test pattern 21 is incorporated in a semiconductor integrated circuit device, and the semiconductor integrated circuit device is fabricated on a semiconductor chip 1. The semiconductor integrated circuit device includes an integrated circuit, which are implemented by active circuit components (not shown), conductive strips 22 and conductive signal lines (not shown). The semiconductor chip 1 has a major surface, and a lower inter-layered insulating layer 6 is grown so as to cover the major surface. A lattice-like conductive pattern 7 is formed on the lower inter-layered insulating layer 6 as well as signal lines (not shown) forming parts of the integrated circuit, and the conductive pattern 7 and the signal lines are covered with the upper inter-layered insulating layer 2. The lattice-like conductive pattern 7 is connected to the test pattern 21. The lower inter-layered insulating layer 6 and the upper inter-layered insulating layer 2 form parts of a multi-layered insulating structure.

The upper inter-layered insulating layer 2 has an upper surface, which is assigned partially to the conductive strips 22 and partially to the test pattern 21. The area assigned to the test pattern 21 is indicated by hatching lines in FIG. 6.

The conductive strips 22 are arranged in a matrix, and each of the conductive strips 22 is spaced from the adjacent conductive strips 22 by the narrowest gap defined in the minimum design rule. The test pattern 21 has a plurality of conductive strips 3 and 4, and the conductive strips 3 and 4 are formed on the upper inter-layered insulating layer 2. The conductive strips 3 and 4 are two-dimensionally arranged on the upper inter-layered insulating layer 2, and the conductive strips labeled with reference numeral 3 are altered with the conductive strips labeled with reference numeral 4. Contact holes are formed in the upper inter-layered insulating layer 2, and the lattice-like conductive pattern 7 is exposed to the contact holes. The conductive plugs 5 fill the contact holes, respectively. The conductive plugs 5 are located under the conductive strips 3, and are held in contact with the lattice-like conductive pattern 7. Thus, the conductive plugs 5 are provided between the conductive strips 3 and lattice-like conductive pattern 7, and the conductive strips 3 are electrically connected to one another by means of the conductive plugs 5 and the lattice-like conductive pattern 7.

The conductive strips 3 and 4 are similar in shape to the conductive strips 22, and each of the conductive strips 3/4 is spaced from the adjacent conductive strips 4/3 by the narrowest gap defined as the minimum design rule. In this instance, the conductive strips 3 and 4 are equal in dimensions to the conductive strips 22. The test pattern 12 or the array of conductive strips 3 and 4 is formed concurrently with the conductive strips 22.

The semiconductor integrated circuit device implementing the second embodiment is fabricated through the following process. The active circuit components such as bulk transistors are fabricated on the major surface of the semiconductor substrate 1, and are covered with the lower inter-layered insulating layer 6. Other circuit components such as resistors and thin film transistors and the lattice-like conductive pattern 7 are fabricated and patterned on the lower inter-layered insulating layer 6. The other circuit components and the lattice-like conductive pattern 7 are covered with the upper inter-layered insulating layer 2.

Photo-resist solution is spun onto the upper inter-layered insulating layer 2, and is baked so as to form a photo-resist layer. A pattern image for contact holes are transferred from a photo-mask to the photo-resist layer, and a latent image is formed in the photo-resist layer. The latent image is developed so that a photo-resist etching mask (not shown) is patterned on the upper inter-layered insulating layer 2. Using the photo-resist etching mask, the upper inter-layered insulating layer 2 is selectively etched, and the contact holes are formed in the upper inter-layered insulating layer 2.

Conductive material is deposited over the entire surface of the resultant structure by using a chemical vapor deposition, and fills the contact holes. The conductive material swells into a conductive layer extending on the upper inter-layered insulating layer 2. The conductive layer is chemically mechanically polished, and conductive plugs are left in the contact holes. Although the contact plugs assigned to the integrated circuit are not shown in FIG. 7, the conductive plugs for the test pattern 21 are labeled with reference numeral 5.

Conductive material is deposited over the entire surface of the resultant structure by using a chemical vapor deposition, and forms a conductive layer on the upper inter-layered insulating layer 2. Photo-resist solution is spun onto the conductive layer, and is baked so as to form a photo-resist layer. A pattern image for the conductive strips 21/22 are transferred from a photo-mask to the photo-resist layer, and a latent image is formed in the photo-resist layer. The latent image is developed so that a photo-resist etching mask (not shown) is patterned on the conductive layer. Using the photo-resist etching mask, the conductive layer is selectively etched, and the conductive strips 22 and the test pattern 21 are formed on the upper inter-layered insulating layer 2.

If the pattern transfer is improper, a pattern defect is left in the photo-resist etching mask, and, accordingly, the pattern defect is transferred to the conductive material layer.

If the etching is improper, pieces of etching residue are left on the inter-layered insulating layer 2. These conductive pieces, which are undesirably left on the inter-layered insulating layer 2, are causative of a short-circuit between the capacitor electrodes. When the conductive pieces are undesirably left in the area assigned to the integrated circuit, other conductive pieces are liable to be left in the area assigned to the test pattern 21. The conductive pieces are also causative of a short-circuit between the conductive strip 3 and the adjacent conductive strip 4. If a conductive strips 22 is short-circuited with another conductive strip 22 due to the improper step, the improper step possibly has the same influence on the test pattern 21, and a short-circuit takes place in the test pattern 21 due to the same improper step. Therefore, when a short-circuit takes place in the conductive strips 22, an analyst checks the test pattern 21 to see whether or not a conductive strip 3/4 is electrically connected to the adjacent conductive strip 4/3 for the trouble shooting. A scanning electron beam microscopy is used in the analysis as follows.

First, the semiconductor integrated circuit device is placed in a vacuum chamber of the scanning electron beam microscopy, and an electron beam is radiated to the semiconductor integrated circuit device. The area assigned to the test pattern 21 is scanned with the electron beam. An appropriate grid is placed in front of a detector so as to cause the detector to capture only the secondary electron with the energy over a threshold.

Assuming now that one of the conductive strips 4 is properly isolated from the adjacent conductive strips 3, when the conductive strips 4 is radiated with the electron beam, the conductive strip 4 is positively or negatively charged, and the energy of the secondary electron is negatively or positively shifted. When the conductive strip 4 is positively charged, the amount of secondary electron captured by the grid is smaller than the amount of secondary electron radiated from the non-charged conductive strip 3. On the other hand, if the conductive strip 4 is negatively charged, the amount of secondary electron captured by the grid is larger than the amount of secondary electron radiated from the non-charged conductive strip 3. The polarity of the charged conductive strip 4 is dependent on the material and the dimensions of the conductive strip 4, the material of the inter-layered insulating layer 2 and the energy of the electron beam.

If the conductive strip 4 to be positively charged is short circuited with the adjacent conductive strip 3, the conductive strip 4 is equivalent to a wide conductive strip, because the conductive strips 3 are connected to one another through the lattice-like conductive pattern 7. In other words, the conductive strip 4 is not strongly charged. The energy of secondary electron radiated from the conductive strip 4 short circuited with the adjacent conductive strip 3 is higher than that radiated from a conductive strip 4 positively charged, and the amount of secondary electron captured by the grid is more than that radiated from the conductive strip 4 positively charged.

The analyst decides whether or not a short-circuit takes place on the basis of the dispersion of the amount or intensity of secondary electron. The amount of secondary electron is compared with a threshold, or the amount of secondary electron radiated from every second conductive strip is picked up from the dispersion for comparing each value with other values.

When a conductive strip 4 is short circuited with the adjacent conductive strips 3, the analyst observes the conductive strip 4 for the trouble shooting.

The present inventor evaluated the above-described testing method. First, the present inventor fabricated the structure shown in FIG. 4 on the semi-conductor substrate 1. The lower inter-layered insulating layer 6 was 500 nanometers thick, and the lattice-like conductive pattern 7 of aluminum was formed on the lower inter-layered insulating layer 6 by using a sputtering, the photo-lithography and a dry etching. The conductive material was deposited to 0.5 micron thick, and the upper inter-layered insulating layer 2 was laminated. The contact holes were formed in the upper inter-layered insulating layer 2 by using the photo-lithography and the dry etching. The contact hole measured 0.5 micron square. Tungsten was deposited to 0.6 micron thick on the upper inter-layered insulating layer 2 by using the chemical vapor deposition technique. The tungsten layer was chemically mechanically polished so that the conductive plugs 5 were left in the contact holes. The conductive plugs 5 were connected to the lattice-like conductive pattern 7. The tungsten was deposited to 0.3 micron thick over the entire surface of the resultant structure by using the chemical vapor deposition, and the tungsten layer was patterned into the conductive strips 3 and 4 by using the photo-lithography and the dry etching. The conductive strip 3/4 was 0.5 micron in width and 1 micron in length. Thus, a sample was fabricated.

Figure 8:
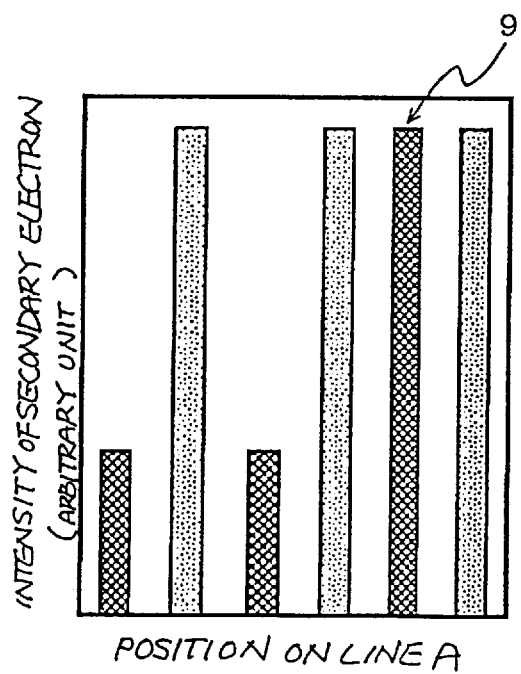
FIG. 8 is a graph showing a dispersion of the intensity of secondary electron along line A.

Subsequently, the present inventor placed the sample in a scanning electron beam microscopy, and radiated the test pattern 12 along line A (see FIG. 6) with an electron beam at 1 kilo-volt. The intensity of secondary electron was plotted in FIG. 8. When the conductive strip 4 at point 9 was radiated with the electron beam, the intensity of secondary electron was as strong as that radiated from the adjacent conductive strips 3, and was much stronger than that radiated from the conductive strips 4 on the left/right sides of the conductive strips 3. The present inventor focused the scanning electron beam microscopy on the conductive strip 4 at point 9, and confirmed that the conductive strip 4 at point 9 was short circuited with the adjacent conductive strip 3.

As will be understood from the foregoing description, the conductive strips 3/4 are designed and formed under the minimum design rule as similar to the conductive strips 22 of the integrated circuit. If the pattern transfer and/or the dry etching is improper, the short-circuits possibly take place in the test pattern 21 as well as the conductive strips 22. Any additional wiring strip is not required for the testing method according to the present invention. Thus, the test pattern 21 does not occupy a wide area, and the short-circuit is certainly detected.

Moreover, the time period consumed by the test is shortened. This is because of the fact that the test pattern 21 is scanned with the relatively wide electron beam, because the intensity of secondary electron is monitored.

The relatively wide conductive strips 4 are scanned with the electron beam. It is not required directly to scan the short-circuit with the electron beam. Even if an extremely small piece of conductive material is the origin of the short-circuit, the analyst can scan the conductive strips 4 with the electron beam. This results in that the analyst can find the short-circuit resulted from the extremely small piece of conductive material.

The testing method implementing the second embodiment is applicable to the conductive strips 22 not connected to the semiconductor chip. Thus, the testing method is wide in the application.

Although particular embodiments of the present invention have been shown and described, it will be apparent to those skilled in the art that various changes and modifications may be made without departing from the spirit and scope of the present invention.

Even if the conductive strips 22 or signal lines are not patterned under the minimum design rule, the testing method according to the present invention is advantageous over the prior art test methods.

What is claimed is:

1. A semiconductor device fabricated on a substrate, comprising:

an insulating layer formed over a major surface of said substrate;

conductive strips formed in a pattern on said insulating layer, and incorporated in an electric circuit; and test conductive strips formed in at least a part of said pattern on said insulating layer concurrently with said pattern of conductive strips, and broken down into a first group consisting of certain test conductive strips electrically isolated and a second group consisting of remaining test conductive strips alternated with said certain test conductive strips and connected to another conductive strip.

2. The semiconductor device as set forth in claim 1, in which said another conductive strip are implemented by conductive plugs filling contact holes formed in said insulating layer and electrically connected to said substrate formed of a semiconductor.

3. The semiconductor device as set forth in claim 2, in which said test conductive strips are arranged in a matrix on said insulating layer, and said conductive strips are also arranged in a matrix and electrically connected to said substrate.

4. The semiconductor device as set forth in claim 3, in which each of said test conductive strips is spaced from adjacent test conductive strips by a gap defined in a minimum design rule, and each of said conductive strips is spaced from adjacent conductive strips by said gap.

5. The semiconductor device as set forth in claim 4, in which said conductive strips serve as electrodes of capacitors.

6. The semiconductor device as set forth in claim 5, in which said capacitors are used for storing pieces of data information.

7. The semiconductor device as set forth in claim 6, in which said capacitors are incorporated in dynamic random access memory cells, respectively.

8. The semiconductor device as set forth in claim 1, in which said another conductive strip are implemented by conductive plugs filling contact holes formed in said insulating layer and a conductive strip connected to said conductive plugs under said insulating layer.

9. The semiconductor device as set forth in claim 8, in which said test conductive strips are arranged in a matrix on said insulating layer, and said conductive strips are also arranged in a matrix and electrically connected to said substrate.

10. The semiconductor device as set forth in claim 9, in which each of said test conductive strips is spaced from adjacent test conductive strips by a gap defined in a minimum design rule, and each of said conductive strips is spaced from adjacent conductive strips by said gap.

* * * * *